United States Patent
Suzuki et al.

(10) Patent No.: US 6,294,255 B1
(45) Date of Patent: Sep. 25, 2001

(54) METHOD OF AND STRUCTURE FOR FIXING A FLEXIBLE ELECTRICAL CONDUCTOR

(75) Inventors: Masataka Suzuki; Hiroyuki Ashiya; Koji Koike; Shinobu Mochiduki, all of Shizuoka (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 09/689,594

(22) Filed: Oct. 13, 2000

Related U.S. Application Data

(62) Division of application No. 09/106,044, filed on Jun. 29, 1998, now Pat. No. 6,156,138.

(51) Int. Cl.[7] ................................................ H01R 9/03
(52) U.S. Cl. .................. 428/375; 174/88 R; 439/874
(58) Field of Search .................. 156/47, 55, 73.1, 156/73.2, 196, 199; 228/110.1, 1.1; 428/357, 364, 375; 174/84 R, 88 R; 439/874

(56) References Cited

U.S. PATENT DOCUMENTS

| | | | |
|---|---|---|---|
| 5,642,852 | 7/1997 | Suzuki et al. | 228/110.1 |
| 5,762,507 | 6/1998 | Mochizuki et al. | 439/164 |
| 5,785,786 | 7/1998 | Suzuki et al. | 156/73.1 |
| 5,821,465 | 10/1998 | Tanaka et al. | 174/88 R |
| 5,925,202 | 7/1999 | Ide et al. | 156/73.2 |
| 5,947,770 | 9/1999 | Shinchi | 439/656 |
| 5,954,549 | 9/1999 | Shinchi | 439/874 |
| 6,156,138 | * 12/2000 | Suzuki et al. | 156/55 |

FOREIGN PATENT DOCUMENTS 0 411 613 A2    2/1991 (EP).

* cited by examiner

*Primary Examiner*—James Sells
(74) *Attorney, Agent, or Firm*—Finnegan, Henderson, Farabow, Garrett & Dunner, L.L.P.

(57) ABSTRACT

A method of fixing a flexible electrical conductor, in which a plurality of flat conductors in which their connecting ends to be connected to another circuit are exposed are integrally covered with a resin-made cladding member, to a fixing portion for connection to the other circuit, comprises the steps of: placing the cladding member on this side of the connecting ends on the fixing portion; and welding together the cladding member on this side of the connecting ends and the fixing portion so as to fix the flexible electrical conductor to the fixing portion. As a result, even if an external force is applied to the flexible electrical conductor, the force is not applied directly to a connecting portion for connecting the connecting ends to connecting ends of the other circuit, thereby improving the electrical reliability in the connection.

1 Claim, 4 Drawing Sheets

METHOD OF AND STRUCTURE FOR FIXING A FLEXIBLE ELECTRICAL CONDUCTOR

This is a division of application Ser. No. 09/106,044, filed Jun. 29, 1998, U.S. Pat. No. 6,156,138 which is incorporated herein by reference.

BACKGROUND OF THE INVENTION

The present invention relates to a method of and a structure for fixing a flexible electrical conductor, in which a plurality of electrical conductors are covered with a resin-made cladding member, to a fixing portion for connection to another circuit.

FIGS. 1 and 2 respectively show connecting portions 1 and 3 of flat electric wires (flexible electrical conductors) disclosed in Japanese Utility Model Application Laid-Open No. 30723/1991, as well as a flexible electrical conductor 5 connected to the connecting portion 1 or 3.

In the connecting portion 1 shown in FIG. 1, a step portion 7 is formed at a distal end portion, and connecting terminals 9 are exposed on this step portion 7. A pair of positioning holes 11 are formed at a distal end portion of the step portion 7. Meanwhile, the flexible electrical conductor 5 connected to this connecting portion 1 is covered with a cladding member 15 in which distal end portions of three flat conductors 13 are exposed. A pair of through holes 17 are formed in an end portion of the cladding member 15. A pair of fixing pins 21 of a fixing cover 19 are inserted in the through holes 17.

In a case where the flat conductors 13 of the flexible electrical conductor 5 are connected to the connecting terminals 9, the flexible electrical conductor 5 is placed on the step portion 7, and after the flat conductors 13 are superposed on the connecting terminals 9, the fixing pins 21 of the fixing cover 19 are inserted into the through holes 17 and the positioning holes 11. Next, distal end portions of the fixing pins 21 which passed through the positioning holes 11 and projected to the reverse side are caulked by heating. Consequently, the flexible electrical conductor 5 is nipped by the fixing cover 19 and the step portion 7, thereby allowing the flat conductors 13 to be electrically connected to the connecting terminals 9.

On the other hand, in the connecting portion 3 shown in FIG. 2, a pair of fixing pins 23 are provided projectingly on a distal end portion of the step portion 7. When the flexible electrical conductor 5 is placed on the step portion 7, the fixing pins 23 are inserted into the through holes 17, and after a fixing cover 25 is placed on top of the flexible electrical conductor 5, the fixing pins 23 are inserted into a pair of positioning pins 27 in the fixing cover 25. Next, distal end portions of the fixing pins 23 which projected from the positioning holes 27 of the fixing cover 25 are caulked by heating. Consequently, the flexible electrical conductor 5 is nipped by the fixing cover 25 and the step portion 7, thereby allowing the flat conductors 13 to be electrically connected to the connecting terminals 9.

In the case where the flexible electrical conductor 5 is connected to the aforementioned connecting portion 1 or 3, the cladding member 15 is nipped by the fixing cover 19 or 15 and the step portion 7 in which the longitudinal offset is prevented by the fixing pins 21 or 23, and the flat conductors 13 are electrically connected to the connecting terminals 9.

In the connecting portion 1 or 3, the positioning of the flat conductors 13 and the connecting conductors is effected by inserting the fixing pins 21 or 23 into the through holes 17.

However, there is a problem in that, in the aforementioned connecting portion 1 or 3, if the caulked portions of the fixing pins 21 or 23 become loose, play occurs between the fixing cover 19 or 25 and the step portion 7, and the state of close contact deteriorates, with the result that the electrical reliability in the connection declines.

In addition, if a force moving in the axial direction away from the connecting portion 1 or 3 is applied to the flexible electrical conductor 5, that force is concentrated on the fixing pins 21 or 23, the force is applied locally to the cladding member 15. For this reason, there is a possibility that the cladding member breaks. Further, if the force moving in the axial direction away from the connecting portion 1 or 3 is applied, the force is applied directly to the connecting portion 1 or 3, so that there is a possibility that the flat conductors 13 and the connecting terminals 9 may offset from each other. As a result, the reliability in electrical connection declines.

Furthermore, there is a problem in that when the flexible electrical conductor 5 is connected to the connecting portion 1 or 3, the fixing cover 19 or 25 is required, so that the number of component parts used increases, resulting in higher cost.

SUMMARY OF THE INVENTION

Accordingly, it is an object of the present invention to provide a method of and a structure for fixing a flexible electrical conductor which make it possible to prevent the deterioration of the state of close contact between the electrical conductor and connecting terminals of another circuit, which make it possible to prevent an external force, if applied, from being applied directly to the portion connected to a connecting portion of another circuit, and which make it possible to reduce the number of component parts used.

To this end, in accordance with a first aspect of the present invention, there is provided a method of fixing a flexible electrical conductor, in which a plurality of flat conductors in which their connecting ends to be connected to another circuit are exposed are integrally covered with a resin-made cladding member, to a fixing portion for connection to the other circuit, comprising the steps of: placing the cladding member on this side of the connecting ends on the fixing portion; and welding together the cladding member on this side of the connecting ends and the fixing portion so as to fix the flexible electrical conductor to the fixing portion.

In accordance with the first aspect of the invention, after the cladding member on this side of the connecting ends of the flexible electrical conductor is placed on the fixing portion, the cladding member on this side of the connecting ends and the fixing portion are welded together. As a result, the flexible electrical conductor is fixed to the fixing portion. In this case, since the cladding member on this side of the connecting ends is welded to the fixing portion, an external force applied to the flexible electrical conductor is not transmitted directly to the connecting ends and the connecting portion, with the result that the connecting ends and the connecting ends of another circuit are prevented from offsetting from each other.

In accordance with a second aspect of the present invention, in the method of fixing a flexible electrical conductor according to the first aspect of the invention, in which the cladding member on this side of the connecting ends is placed on the fixing portion in close contact therewith, ultrasonic vibrations are applied to the cladding member on this side of the connecting ends and the fixing portion so as to effect welding.

In accordance with the second aspect of the invention, in the state in which the cladding member on this side of the connecting ends is placed on the fixing portion in close contact therewith, ultrasonic vibrations are applied to the cladding member on this side of the connecting ends and the fixing portion. Consequently, the cladding member and the fixing portion are welded together, thereby allowing the flexible electrical conductor to be fixed to the fixing portion.

In accordance with a third aspect of the present invention, in the method of fixing a flexible electrical conductor according to the first or second aspect of the invention, an irregular surface portion is provided on the fixing portion along a direction perpendicular to a longitudinal direction of the flat conductors.

In accordance with the third aspect of the invention, the cladding member on this side of the connecting ends is placed on the irregular surface portion provided on the fixing portion along a direction perpendicular to the longitudinal direction of the flat conductors, and this irregular surface portion and the cladding member are welded together. In this case, by virtue of the provision of the irregular surface portion on the fixing portion, the area of contact between the cladding member and the fixing portion becomes large.

In accordance with a fourth aspect of the present invention, in the method of fixing a flexible electrical conductor according to any one of the first to third aspects of the invention, in state in which the plurality of flat conductors which are elongated are arranged planarly substantially planarly at predetermined intervals, the flexible electrical conductor is covered with the resin-made cladding member.

In accordance with the fourth aspect of the invention, since the resinous cladding member which covers the plurality of flat conductors arranged planarly substantially in parallel at predetermined intervals is welded to the fixing portion, the flexible electrical conductor is fixed to the fixing portion. In this case, even if an external force is applied to the flexible electrical conductor along its longitudinal direction, the external force is applied to the overall welded portion of the welded cladding member, and the force is not applied directly to the connecting portion correcting the conductors and the other circuit.

In accordance with a fifth aspect of the present invention, there is provided a structure for fixing a flexible electrical conductor, in which a plurality of flat conductors in which their connecting ends to be connected to another circuit are exposed are integrally covered with a resin-made cladding member, to a fixing portion for connection to the other circuit, wherein the cladding member on this side of the connecting ends is welded to the fixing portion.

In accordance with the fifth aspect of the invention, the cladding member on this side of the connecting ends is welded to the fixing portion so as to fix the flexible electrical conductor to the fixing portion.

In accordance with a sixth aspect of the present invention, in the structure for fixing a flexible electrical conductor according to the fifth aspect of the invention, an irregular surface portion is provided on the fixing portion.

In accordance with the sixth aspect of the invention, since the irregular surface portion is provided on the fixing portion, the welding area between the cladding member on this side of the connecting ends and the fixing portion becomes large.

The above and other objects, features and advantages of the present invention will become more apparent from the following detailed description of the invention when read in conjunction with the accompanying drawings.

BRIEF DESCRIPTION OF THE DRAWINGS

FIGS. 3(a) and 3(b) are diagrams illustrating a first embodiment of a method of fixing a flexible electrical conductor in accordance with the present invention, in which FIG. 3(a) is a perspective view of the flexible electrical conductor and a fixing portion, and FIG. 3(b) is a cross-sectional view thereof;

DETAILED DESCRIPTION OF THE PREFERRED EMBODIMENTS

Referring now to the accompanying drawings, a description will be given of embodiments of the structure for a method of fixing a flexible electrical conductor in accordance with the present invention.

First Embodiment

Figure 1:
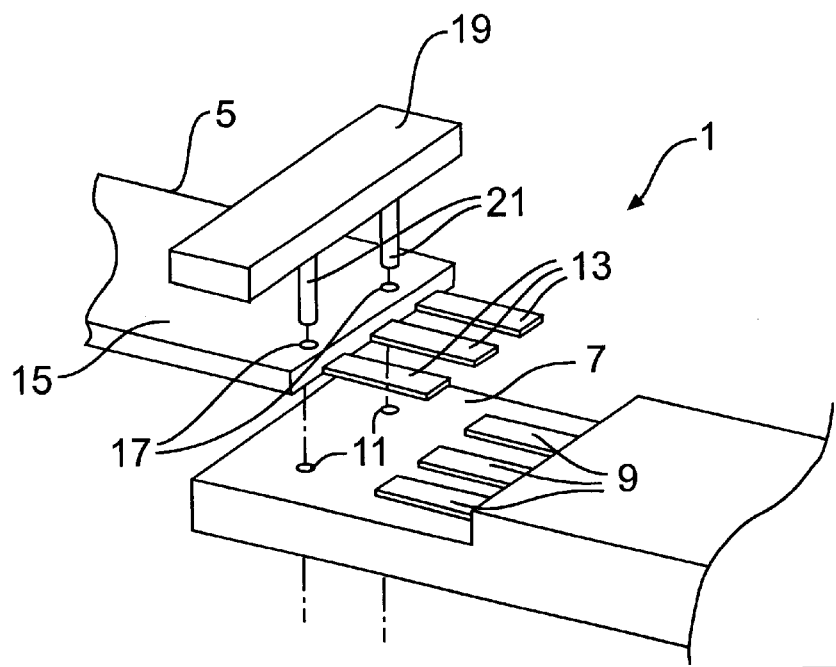
FIG. 1 is a perspective view illustrating a conventional method of and a structure for fixing a flexible electrical conductor.
Figure 2:
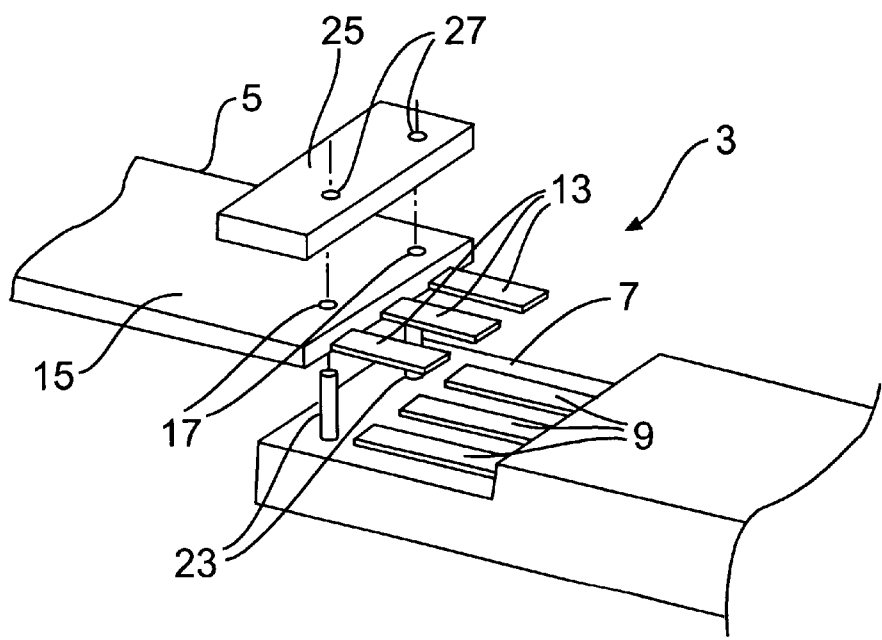
FIG. 2 is a perspective view illustrating a another conventional method of and a structure for fixing a flexible electrical conductor.
Figure 3A:
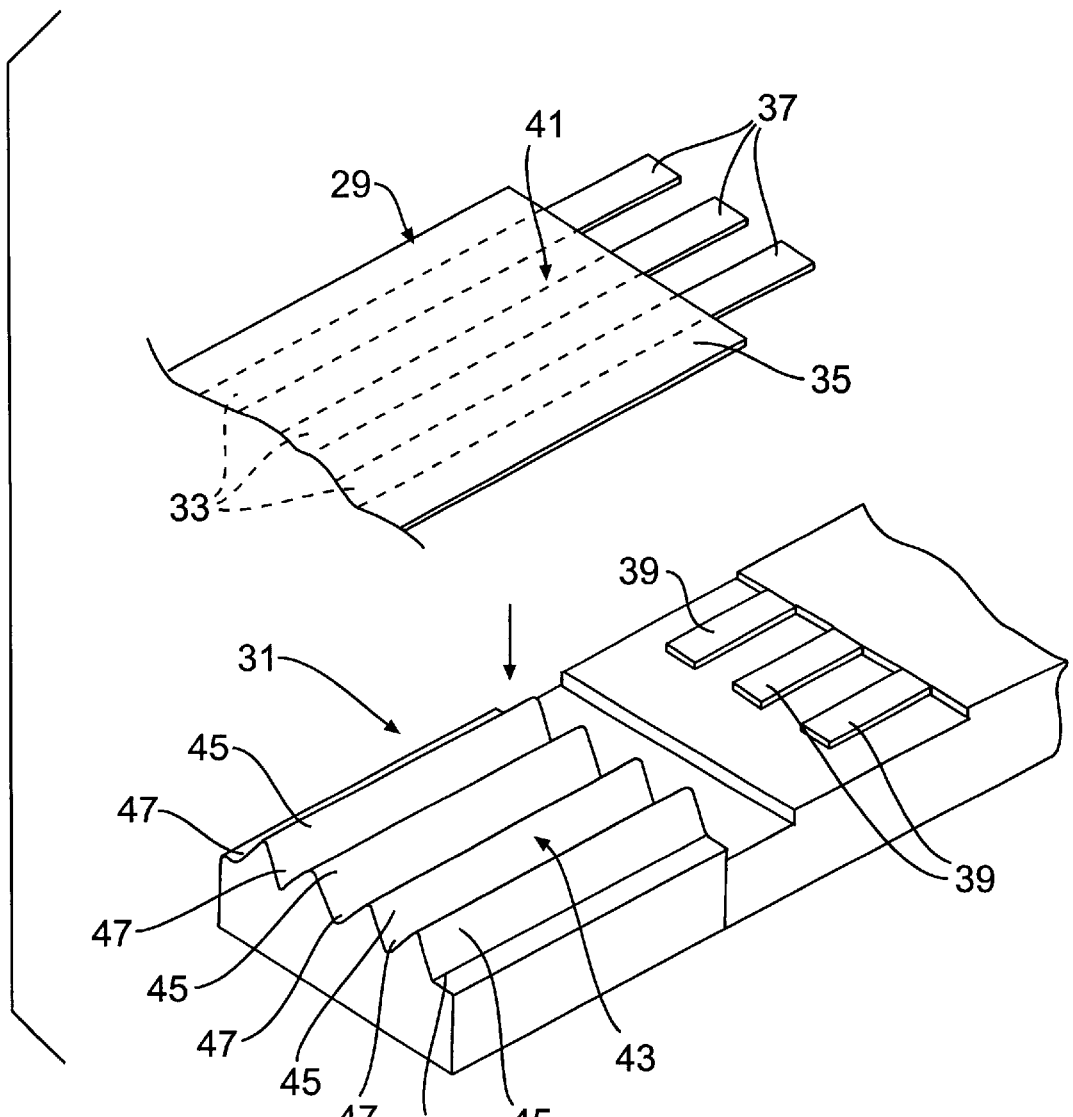

FIGS. 3(a) and 1(b) show a flexible electrical conductor 29 and a fixing portion 31 made of PBT (polybutylene terephtalate) or the like in accordance with a first embodiment. FIG. 3(a) is a perspective view of the flexible electrical conductor 29 and the fixing portion 31 to which this flexible electrical conductor 29 is fixed, while FIG. 3(b) is a cross-sectional view illustrating a state in which the flexible electrical conductor 29 is welded to the fixing portion 31.

Figure 3B:
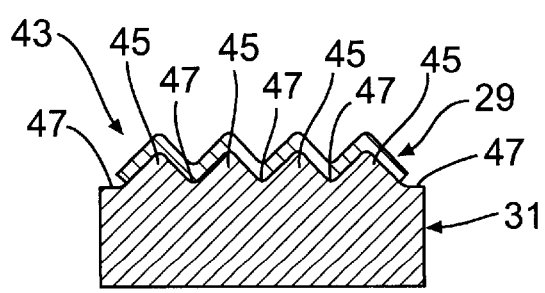

As shown in FIGS. 3(a) and 3(b), the flexible electrical conductor 29 is arranged such that three elongated flat conductors 33 are arranged planarly substantially parallel to each other at predetermined intervals, and are covered with a resin-made cladding member 35. Distal end portions of the flat conductors 33 are exposed to form connecting terminals 37. These connecting terminals 37 are connected to connecting terminals 39 of another circuit. The cladding member 35 on this side of the connecting terminals 37 is formed as a welding portion 41 which is welded to the fixing portion 31.

The fixing portion 31 has an irregular surface portion 43 in which a serrated formation is arranged along a direction perpendicular to the longitudinal direction of the flat conductors 33 (the axial direction of the fixing portion 31). This irregular surface portion 43 is comprised of four angular edges 45 and notches 47 provided between adjacent ones of the angular edges 45 and on outer sides of the outermost angular edges 45. In the state in which the welding portion 41 is welded onto the fixing portion 31, the flat conductors 33 are superposed on the connecting terminals 39 of the other circuit in contact therewith, and are electrically connected thereto.

Next, a description will be given a method of fixing the flexible electrical conductor 29 to the fixing portion 31.

First, after the welding portion 41 on this side of the connecting terminals 37 is placed on the fixing portion 31, the welding portion 41 and the fixing portion 31 are welded to each other. In this case, in which the edges 45 of the irregular surface portion 43 abut against the cladding member 35 between the flat conductors 33, the welding portion 41 and the fixing portion 31 are welded to each other by applying heat or ultrasonic vibrations to the fixing portion 31 and the cladding member 35. In this case, since the welding portion 41 is welded in close contact with the irregular surface portion 43, the welding portion 41 also assumes a serrated form. Thus the flexible electrical conductor is fixed to the fixing portion 31. In this state, the connecting terminals 37 are superposed in close contact with the connecting terminals 39 of the other circuit, and are electrically connected thereto.

In accordance with this embodiment, since the welding portion 41 is welded directly to the fixing portion 31, the connecting terminals 37 and the connecting terminals 39 of the other circuit are superposed on top of each other in close contact. In addition, an external force applied to the flexible electrical conductor 29 is not transmitted to the portion connecting the connecting terminals 37 and the connecting terminals 39 of the other circuit. Further, since the external force applied to the flexible electrical conductor is not applied locally to the cladding member 35, the cladding member does not break. Accordingly, it is possible to improve the electrical reliability in t he connection.

Further, since the welding portion 41 of the cladding member 35 is welded directly to the fixing portion 31, the state of close contact between the connecting terminals 37 and the connecting terminals 39 of the other circuit does not deteriorate.

Furthermore, in this embodiment, since the fixing portion 31 is provided with the irregular surface portion 43, and the cladding member 35 is welded directly to this irregular surface portion 43, it is possible to secure a large welded area without enlarging the width of the fixing portion 31. Therefore, the welding portion 41 can be fixed more firmly to the fixing portion 31.

That is, although if the fixing portion 31 is planar, an area for welding the welding portion 41 of the cladding member 35 is required by the portion of the widthwise length of the flexible electrical conductor 29, the width of the fixing portion 31 can be made shorter than the width of the flexible electrical conductor 29 by providing the irregular surface portion 43.

Further, since the irregular surface portion 43 is provided along the widthwise direction of the fixing portion 31, even if an external force is applied in the widthwise direction, the flexible electrical conductor 29 is difficult to be offset in the widthwise direction, so that the connecting terminals 37 are not offset from the connecting terminals 39 of the other circuit.

Further, since it is unnecessary to fix the flexible electrical conductor 29 by means of a fixing plate in the conventional manner, the number of component parts used can be reduced, thereby making it possible to lower the manufacturing cost.

Second Embodiment

Figure 4:
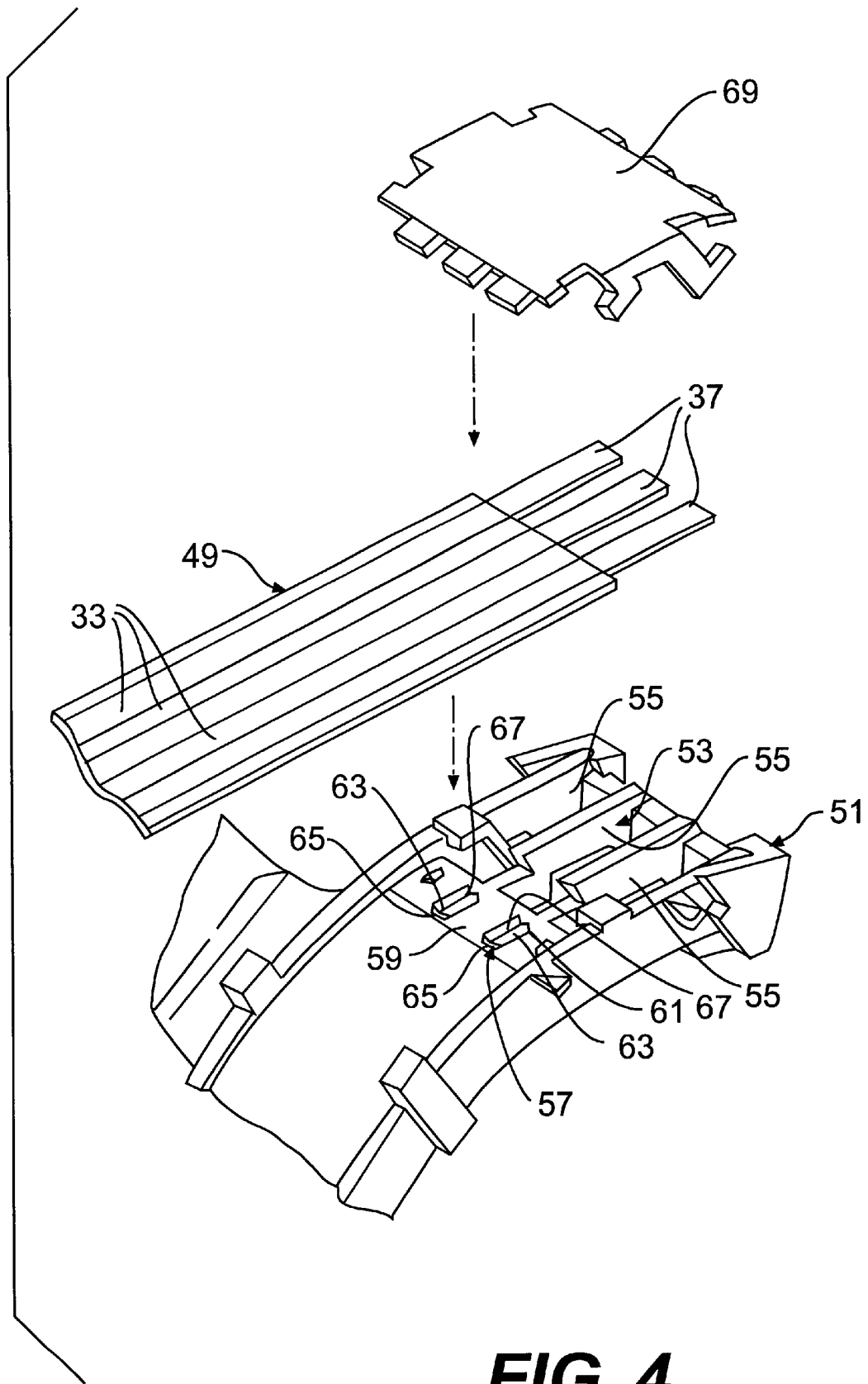
FIG. 4 is an exploded perspective view illustrating a fixing portion and a flexible electrical conductor which is fixed to the fixing portion in a second embodiment of the method of fixing a flexible electrical conductor in accordance with the present invention.

Next, a description will be given of a second embodiment. This second embodiment is a fixing method which is used in fixing a terminal portion of a flexible electrical conductor 49 arranged between a steering wheel and a steering shaft of an automobile to a cable reel (not shown). FIG. 4 is a exploded perspective view illustrating a terminal fixing member 51 for fixing terminals of the cable reel as well as the flexible electrical conductor 49 which is fixed to the terminal fixing member 51.

As shown in FIG. 3, the terminal fixing member 51 is formed in an arcuate shape in terms of its overall configuration, and a retaining portion 53 for retaining connecting terminals (not shown) of another circuit is provided at a distal end portion thereof. The retaining portion 53 has three rectangular hole portions 55 formed in such a manner as to penetrate the terminal fixing member 51 from its obverse side to its reverse side. The connecting terminals 37 of the flexible electrical conductor 49 are placed on these hole portions 55. A fixing portion 57 for fixing the flexible electrical conductor 49 is formed on this side of the retaining portion 53.

Figure 5:
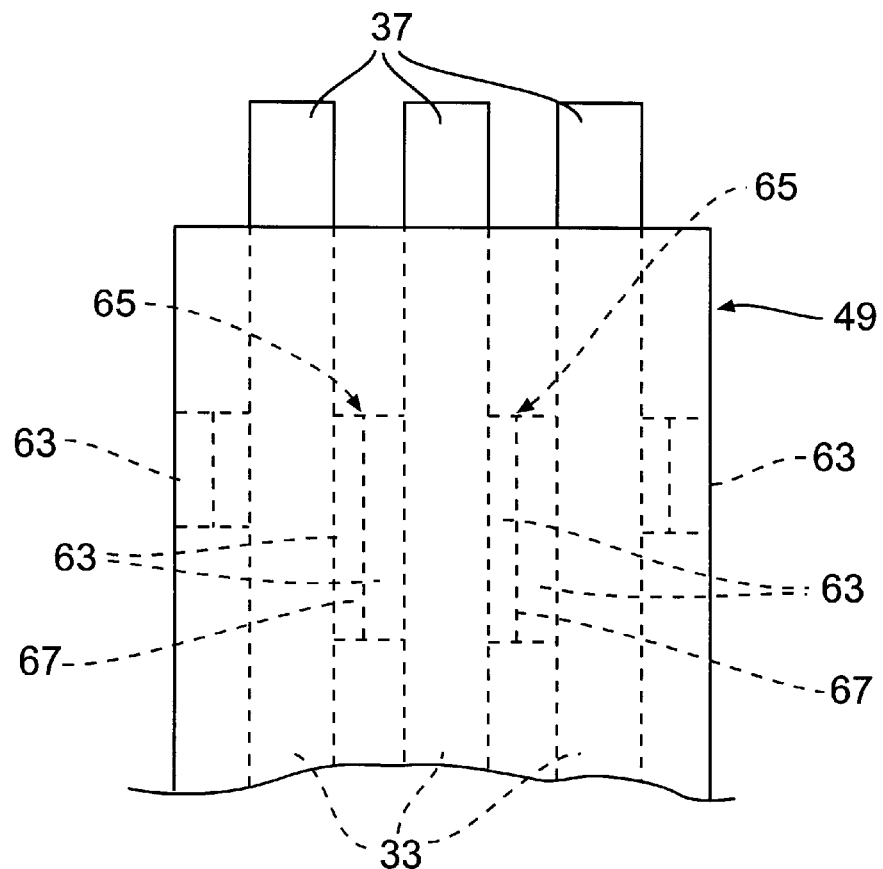
FIG. 5 is a plan view illustrating the fixing portion and the flexible electrical conductor which is fixed to the fixing portion in accordance with the second embodiment.
Figure 6:
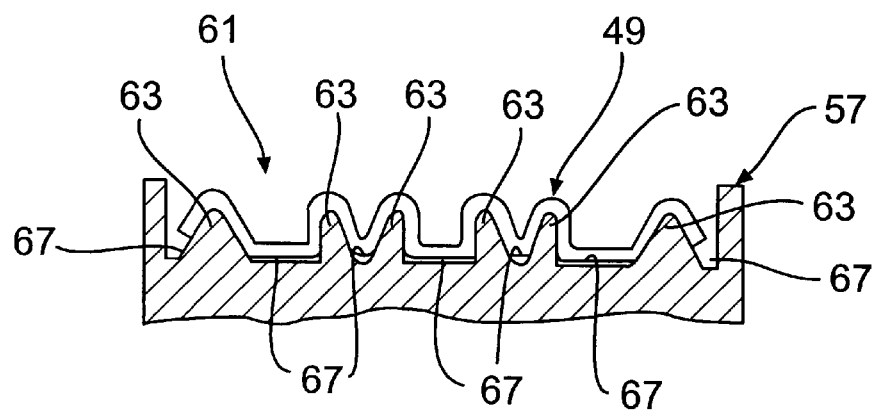
FIG. 6 is a cross-sectional view illustrating the fixing portion and the flexible electrical conductor which is fixed to the fixing portion in accordance with the second embodiment.

The fixing portion 57 has an irregular surface portion 61 formed on a planar upper surface 59. The irregular surface portion 61 is comprised of a pair of angular projections 63 provided on transverse opposite sides of the fixing portion 57 in such a manner as to project from the upper surface 59, as well as a pair of notched projections 65 arranged at equal intervals between the pair of angular projections 63 and each having a substantially M-shaped outer configuration in terms of its cross section. The two projecting edges of each of the pair of notched projections 65 are also formed as a pair of angular projections 63, and recessed portions 67 are formed on transverse opposite sides of the fixing portion 57 and between adjacent ones of all the angular projections 63. Furthermore, as shown in FIGS. 5 and 6, the welding portion 41 of the flexible electrical conductor 49 is welded to the irregular surface portion 61. In this case, as shown in FIG. 5, the welding portion 41 is welded to the fixing portion 57 by thermal welding or ultrasonic vibration welding such that the angular projections 63 are respectively positioned at portions of the cladding member 35 that are located between the flat conductors 33 and on outer sides of the outermost flat conductors 33.

It should be noted that, in FIG. 4, reference numeral 69 denotes a cover for covering the retaining portion 53 and the fixing portion 57. This cover 69 does not serve to fix the flexible electrical conductor 49 to the fixing portion 57, but merely covers the retaining portion 53 and the fixing portion 57 from the outside.

To fix the flexible electrical conductor 49 to the fixing portion 57, the welding portion 41 of the flexible electrical conductor 49 is first placed on the fixing portion 57. In this state, the exposed connecting terminals 37 are located above the hole portions 55 of the retaining portion 53. Next, by applying heat or ultrasonic vibrations to the irregular surface portion 61 and the welding portion 41, the welding portion 41 is welded to the fixing portion 57, as shown in FIG. 6. As a result, the flexible electrical conductor 49 is fixed to the fixing portion 57.

In accordance with this embodiment, since the fixing portion 57 is welded directly to the welding portion 41, an external force applied to the flexible electrical conductor 49 is not transmitted directly to the connecting portion for connecting the connecting terminals 37 and the connecting terminals of the other circuit. Consequently, it is possible to improve the electrical reliability in the connection.

In addition, since it is unnecessary to fix the flexible electrical conductor 49 by means of a fixing plate in the conventional manner, the number of component parts used can be reduced, thereby making it possible to lower the manufacturing cost.

It should be noted that in a case where the welding portion 41 and the fixing portion 57 are welded together, the welding portion 41 and the fixing portion 57 may be welded together by a method other than welding by using heat or welding by using ultrasonic vibrations.

While there has been described in connection with the preferred embodiment of the invention, it will be obvious to those skilled in the art that various changes and modifications may be made therein without departing from the invention, and it is aimed, therefore, to cover in the appended claim all such changes and modifications as fall within the true spirit and scope of the invention.

What is claimed is:

1. A fixing structure comprising:

a flexible electrical conductor having a plurality of flat conductors integrally covered with a resin-made cladding member and also having connecting ends that are connectable to another circuit and at which said plurality of flat conductors are exposed; and a fixing portion for connection to said another circuit, wherein a portion of said cladding member that is between the plurality of flat conductors is welded to said fixing portion and wherein an irregular surface portion is provided on said fixing portion.

* * * * *